(12) United States Patent
Miao et al.

(10) Patent No.: US 7,504,889 B2
(45) Date of Patent: Mar. 17, 2009

(54) CIRCUIT FOR PROVIDING A SIGNAL BOOST

(75) Inventors: Jason Y. Miao, San Jose, CA (US); Timothy G. Moran, San Jose, CA (US)

(73) Assignee: Finisar Corporaton, Sunnyvale, CA (US)

( * ) Notice: Subject to any disclaimer, the term of this patent is extended or adjusted under 35 U.S.C. 154(b) by 29 days.

(21) Appl. No.: 11/734,185

(22) Filed: Apr. 11, 2007

(65) Prior Publication Data

US 2008/0074197 A1 Mar. 27, 2008

Related U.S. Application Data

(60) Provisional application No. 60/827,165, filed on Sep. 27, 2006.

(51) Int. Cl.
*H03F 3/08* (2006.01)
(52) U.S. Cl. ........................... 330/308; 330/260
(58) Field of Classification Search .................. 330/85, 330/252, 259, 260, 261, 308; 250/214 AG
See application file for complete search history.

(56) References Cited

U.S. PATENT DOCUMENTS

| | | | | |
|---|---|---|---|---|
| 6,462,618 B2 * | 10/2002 | Minegishi | ................... | 330/252 |
| 6,605,994 B2 * | 8/2003 | Kim et al. | ................... | 330/252 |
| 6,750,712 B1 * | 6/2004 | Hoang | ..................... | 330/252 |
| 7,193,463 B2 * | 3/2007 | Miyashita et al. | ........... | 330/252 |

* cited by examiner

*Primary Examiner*—Henry K Choe
(74) *Attorney, Agent, or Firm*—Workman Nydegger

(57) ABSTRACT

Embodiments disclosed herein relate to an amplifier stage or circuit for providing a signal boost. The circuit includes an emitter-follower pair and a cross coupled differential pair. The cross coupled differential pair provides a feedback signal that provides a boost to a signal output by the emitter follower pair. In some embodiments, a capacitor of the cross coupled differential pair may be adjustable in order to vary the amount of boosting provided. In other embodiments, a current source of the cross coupled differential pair may be adjustable in order to vary the amount of boosting provided.

23 Claims, 5 Drawing Sheets

CIRCUIT FOR PROVIDING A SIGNAL BOOST

CROSS-REFERENCE TO RELATED APPLICATIONS

This application claims the benefit of U.S. Provisional Application No. 60/827,165, filed Sep. 27, 2006, which is incorporated herein by reference in its entirety.

BACKGROUND

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed there through, the intensity of the emitted light being a function of the current magnitude through the transducer. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include an electro-optic transducer driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to perform various operations with respect to certain parameters of a data signal received by the optical receiver. A controller circuit (hereinafter referred to as the "controller") controls the operation of the laser driver and post-amplifier.

During the operation of an optical transceiver, it is often important to evaluate the quality of a received data signal. One tool often used to help in the evaluation process is an eye diagram or pattern. As is well known, an eye diagram is formed by superimposing a long stream of random bits on one another on an oscilloscope or like device. The bit streams include the transitions from high to low and low to high. Several system performance measures can be derived by analyzing the eye diagram. For example, if the signals are too long, too short, poorly synchronized with the system clock, too high, too low, too noisy, too slow to change, or have too much undershoot or overshoot, this can be observed from the eye diagram. In particular, an open eye diagram generally corresponds to minimal signal distortion.

One important task performed by the post-amplifier is to determine if the bits of the received data signal represent a digital 0 (low) or a digital 1 (high). In order to perform such a task, circuitry in the post-amplifier reads the received data signal and makes the determination. However, if the signal quality is such that the eye diagram has been distorted in a manner that closes the eye diagram, this determination becomes more difficult. In particular, if the eye diagram has been collapsed to approximately 50%, it becomes very difficult for the post-amplifier to distinguish between a high and a low as 50% is near the midpoint of the transition from a high to a low or a low to a high.

Such collapsing of the eye diagram to approximately 50% may occur during a Stress Receive Sensitivity (SRS) test. The SRS test is designed to evaluate the response of the optical transceiver to a collapsed eye diagram. The eye diagram may also be collapsed through signal attenuation and the like in the optical transceiver.

BRIEF SUMMARY

Embodiments disclosed herein relate to an amplifier stage or circuit for providing a signal boost. The circuit may include first and second input nodes configured to receive a differential signal. The circuit may also include first and second output nodes.

The circuit also includes a first transistor having a base terminal coupled to the first input node, an emitter terminal coupled to the first output node, and a collector node configured to be connected to a voltage source when operational. A second transistor has a base terminal coupled to the second input node, an emitter terminal coupled to the second output node, and a collector node configured to be connected to a voltage source when operational. The first and second transistors may comprise an emitter-follower pair.

The circuit further includes a third transistor having a base terminal coupled to the first output node and the emitter terminal of the first transistor and having a collector terminal coupled to the second input node. A fourth transistor has a base terminal coupled to the second output node and the emitter terminal of the second transistor and a collector terminal coupled to the first input node. The third and fourth transistors may comprise a cross coupled differential pair.

The circuit additionally includes a capacitor having a first terminal coupled to an emitter terminal of the third transistor and having a second terminal coupled to an emitter terminal of the fourth transistor. In some embodiments, the capacitor is an adjustable capacitor whose adjustment affects the amount of boost provided by the circuit.

The circuit finally includes at least one current source coupled to the emitter terminal of the third transistor and the emitter terminal of the fourth transistor. In some embodiments, the current source is an adjustable current source whose adjustment affects the amount of boost provided by the circuit.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the embodiments disclosed herein. The features and advantages of the embodiments disclosed herein may be realized and obtained by means of the instruments and combinations particularly pointed out in the appended claims. These and other features of the embodiments disclosed herein will become more fully apparent from the following description and appended claims, or may be learned by the practice of the embodiments disclosed herein as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Embodiments disclosed herein relate to an amplifier stage or circuit for providing a signal boost. The circuit may include first and second input nodes configured to receive a differential signal. The circuit may also include first and second output nodes.

The circuit also includes a first transistor having a base terminal coupled to the first input node, an emitter terminal coupled to the first output node, and a collector node configured to be connected to a voltage source when operational. A second transistor has a base terminal coupled to the second input node, an emitter terminal coupled to the second output node, and a collector node configured to be connected to a voltage source when operational. The first and second transistors may comprise an emitter-follower pair.

The circuit further includes a third transistor having a base terminal coupled to the first output node and the emitter terminal of the first transistor and having a collector terminal coupled to the second input node. A fourth transistor has a base terminal coupled to the second output node and the emitter terminal of the second transistor and a collector terminal coupled to the first input node. The third and fourth transistors may comprise a cross coupled differential pair.

The circuit additionally includes a capacitor having a first terminal coupled to an emitter terminal of the third transistor and having a second terminal coupled to an emitter terminal of the fourth transistor. In some embodiments, the capacitor is an adjustable capacitor whose adjustment affects the amount of boost provided by the circuit.

The circuit finally includes at least one current source coupled to the emitter terminal of the third transistor and the emitter terminal of the fourth transistor. In some embodiments, the current source is an adjustable current source whose adjustment affects the amount of boost provided by the circuit.

I. Operating Environment

Figure 1:
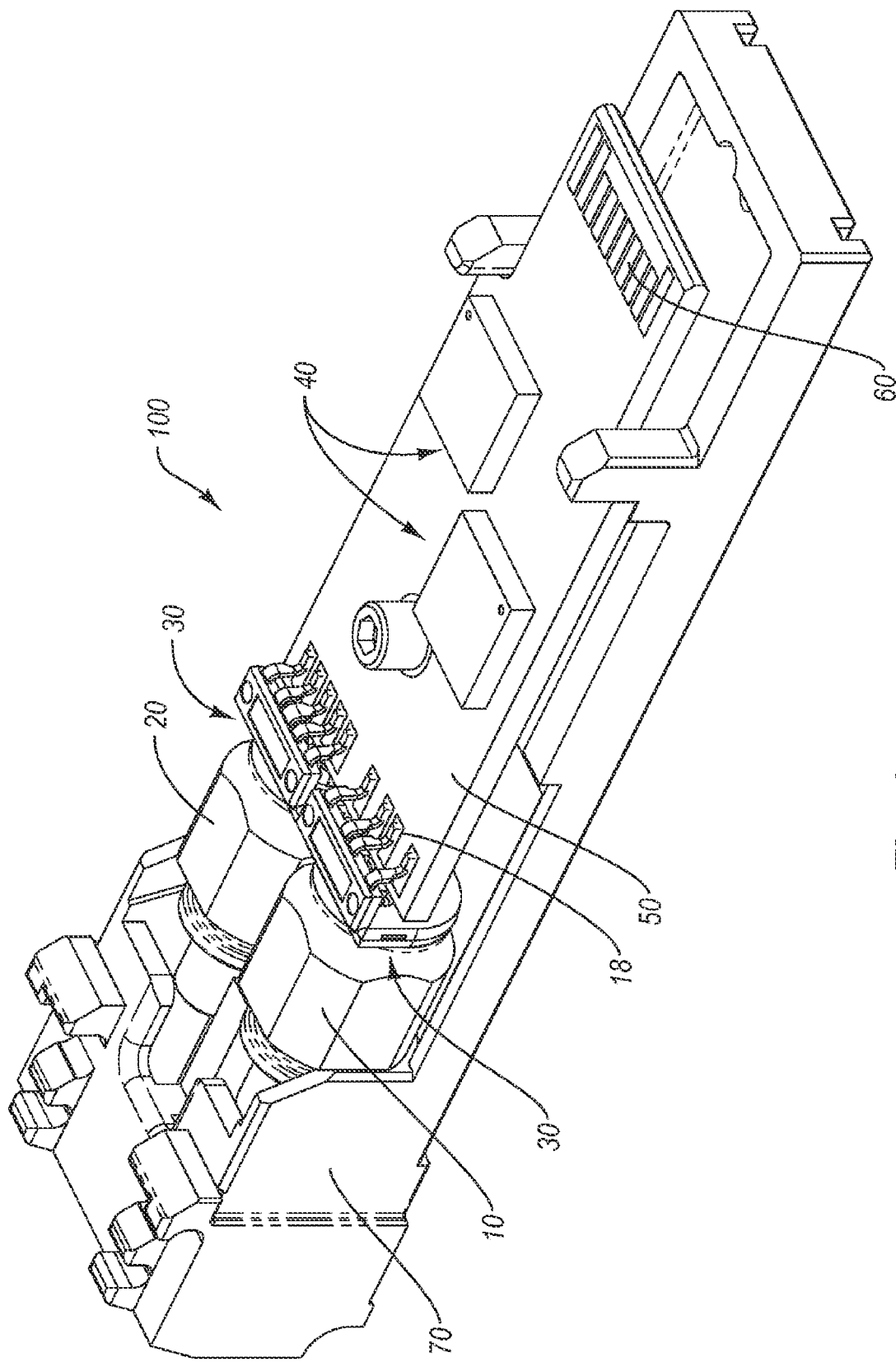
FIG. 1 is a perspective view of an example of an optical transceiver module.

Reference is first made to FIG. 1, which depicts a perspective view of an example optical transceiver module ("transceiver"), generally designated at 100, for use in transmitting and receiving optical signals in connection with an external host that is operatively connected, in one embodiment, to a communications network. As shown, the transceiver shown in FIG. 1 includes various components, including a Receiver Optical Subassembly ("ROSA") 10, a Transmitter Optical Subassembly ("TOSA") 20, electrical interfaces 30, various electronic components 40, such as a laser-driver/post-amplifier and a control module for example, and a printed circuit board 50 which supports the electronic components 40.

In the illustrated embodiment, two electrical interfaces 30 are included in the transceiver 100, one each used to electrically connect the ROSA 10 and the TOSA 20 to a plurality of conductive pads located on the PCB 50. The electronic components 40 are also attached to the PCB 50. An edge connector 60 is located on an end of the PCB 50 to enable the transceiver 100 to electrically and mechanically interface with a host (not shown). In addition, the above-mentioned components of the transceiver 100 are partially housed within a housing 70. Though not shown, some embodiments include a shell that cooperates with the housing 70 to define an enclosure for components of the transceiver 100.

Figure 2:
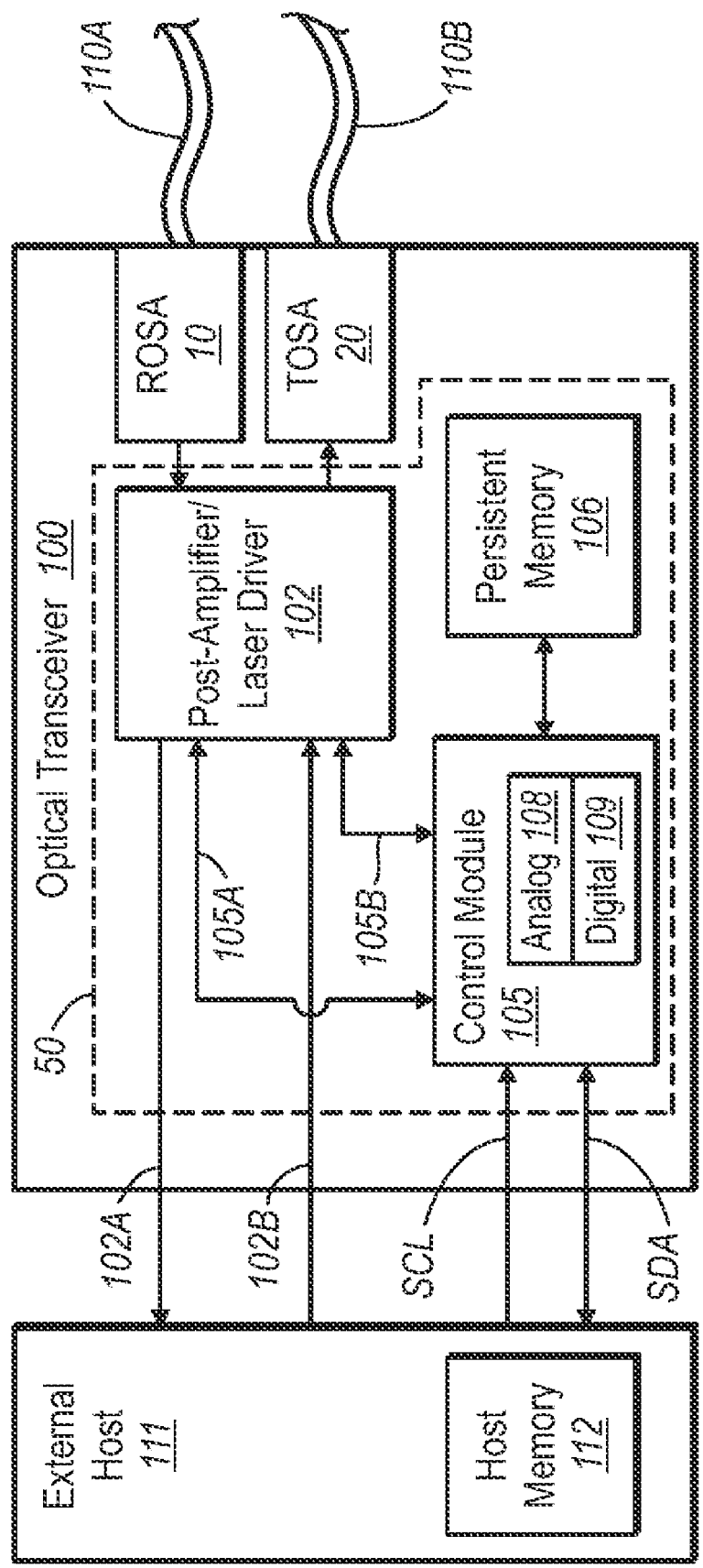
FIG. 2 is a simplified block view showing various aspects of the optical transceiver module of FIG. 1.

Reference is now made to FIG. 2, which is a simplified block diagram of an example of an optical transceiver, denoted at 100 in FIG. 1, depicting various physical and operational aspects of the transceiver. While the optical transceiver 100 will be described in some detail, the optical transceiver 100 is described by way of illustration only, and not by way of restricting the scope of the invention. As mentioned above, the optical transceiver 100 in one embodiment is suitable for optical signal transmission and reception at a variety of per-second data rates, including 1 Gbit/s, 2 Gbit/s, 4 Gbit/s, 8 Gbit/s, 10 Gbit/s, as well as even higher data rates. Furthermore, the embodiments described herein can be implemented in optical transceivers conforming with any of a variety of different form factors, examples of which include, but are not limited to, XFP, SFP, SFP+ and SFF, as well as a variety of different communication protocols, examples of which include, but are not limited to, GiGE, SONET, and Fibre Channel.

With continuing reference to FIG. 2, and with reference as well to FIG. 1, transceiver 100 includes printed circuit board ("PCB") 50 on which the various electronic components of the transceiver are mounted. One such component is a control module 105. Control module 105 is connected to an integrated post-amplifier/laser driver ("PA/LD") 102 by connections 105A and 105B. These connections allow control module 105 to monitor the operation of the post-amplifier/laser driver 102 as will be described in more detail to follow. Control module 105 is connected to a persistent memory 106, which stores microcode for configuring control module 105 and is also used to store operational parameters. The control module 105 is also able to communicate with an external host 111 as depicted by the Serial Data line (SDA) and Serial Clock line (SCL).

Transceiver 100 includes both a transmit path and a receive path, both of which will now be described. The receive path includes ROSA 10, which transforms an incoming optical data signal into an electrical data signal. The electrical data signal is then provided to a post-amplifier portion of PA/LD 102. The post-amplifier amplifies and otherwise processes the electrical data signal and provides the electrical data signal to the external host 111 via connection 102A.

For the transmit path, external host 111 generates an electrical data signal and provides the electrical data signal to a laser driver portion of PA/LD 102 via connection 102B. The laser driver processes the electrical data signal and drives the TOSA 20, which causes the TOSA 20 to emit an optical data signal.

The operation of transceiver 100 will now be described in further detail. In operation, the optical transceiver 100, receives an optical data signal from a fiber 110A via the ROSA 10 in manner to be described more fully below. The ROSA 10 transforms the received optical data signal into an electrical data signal. The ROSA 10 then provides the resulting electrical data signal to a post-amplifier. In the illustrated embodiment, the post amplifier is consolidated with the laser driver as an integrated PA/LD 102. As such, the PA/LD 102 resides on a single integrated circuit chip and is included as a component, together with the other electronic components 40, some of which are further described below, on PCB 50. In other embodiments, the post amplifier and laser driver are implemented as separate components on the PCB 50.

The post-amplifier portion of the PA/LD 102 amplifies the received electrical data signal and provides the amplified data signal to external host 111 over signal path 102A. The external host 111 may be any computing system capable of communicating with the optical transceiver 100. The external host 111 contains a host memory 112 that may be any volatile or non-volatile memory source. In one embodiment, some components of the optical transceiver 100 can reside on the host 111 while the other components of the transceiver reside on the PCB 50 separate from the host 111.

The optical transceiver 100 may also receive electrical data signals from the host 111 for transmission onto a fiber 110B. Specifically, the laser driver portion of the PA/LD 102 receives the electrical data signal from the host 111 via the signal path 102B, and drives a light source within the TOSA 20. One example of a light source is a DML that causes the TOSA 20 to emit onto the fiber 110B optical data signals representative of the information in the electrical data signal provided by the host 111.

The behavior of the ROSA 10, the PA/LD 102, and the TOSA 20 may vary dynamically due to a number of factors. For example, temperature changes, power fluctuations, and feedback conditions may each affect the performance of these components. Accordingly, the transceiver 100 includes a control module 105, which may evaluate environmental conditions, such as temperature, age of the laser, and/or operating conditions, such as voltage, and receive information from the post-amplifier portion of the PA/LD 102 by way of connection 105A, and from the laser driver portion of the PA/LD by way of connection 105B. This arrangement allows the control module 105 to optimize the performance of the laser to compensate for dynamically varying conditions.

Specifically, the control module 105 optimizes the operation of the transceiver 100 by adjusting settings on the PA/LD 102 as represented by the connections 105A and 105B. These settings adjustments can be intermittent and are generally only made when temperature or voltage or other low frequency changes so warrant.

The control module 105 has access to a persistent memory 106, which in one embodiment, is an Electrically Erasable and Programmable Read Only Memory (EEPROM). Persistent memory 106 may also be any other non-volatile memory source. Persistent memory 106 is used to store microcode for configuring control module 105 and for storing operational parameters that have been measured by the control module 105. The persistent memory 106 and the control module 105 may be packaged together in the same package or in different packages without restriction.

Data and clock signals may be provided from the host 111 to the control module 105 using the SDA and SCL lines respectively. Also data may be provided from the control module 105 to the host 111 to allow for transmitting diagnostic data such as environmental and/or operational parameters. The control module 105 includes both an analog portion 108 and a digital portion 109. In this example, the analog portion 108 and the digital portion 109 collectively enable the control module to implement logic digitally, while still largely interfacing with the rest of the optical transceiver 100 using analog signals.

II. Example Embodiment of a Post-Amplifier

Figure 3:
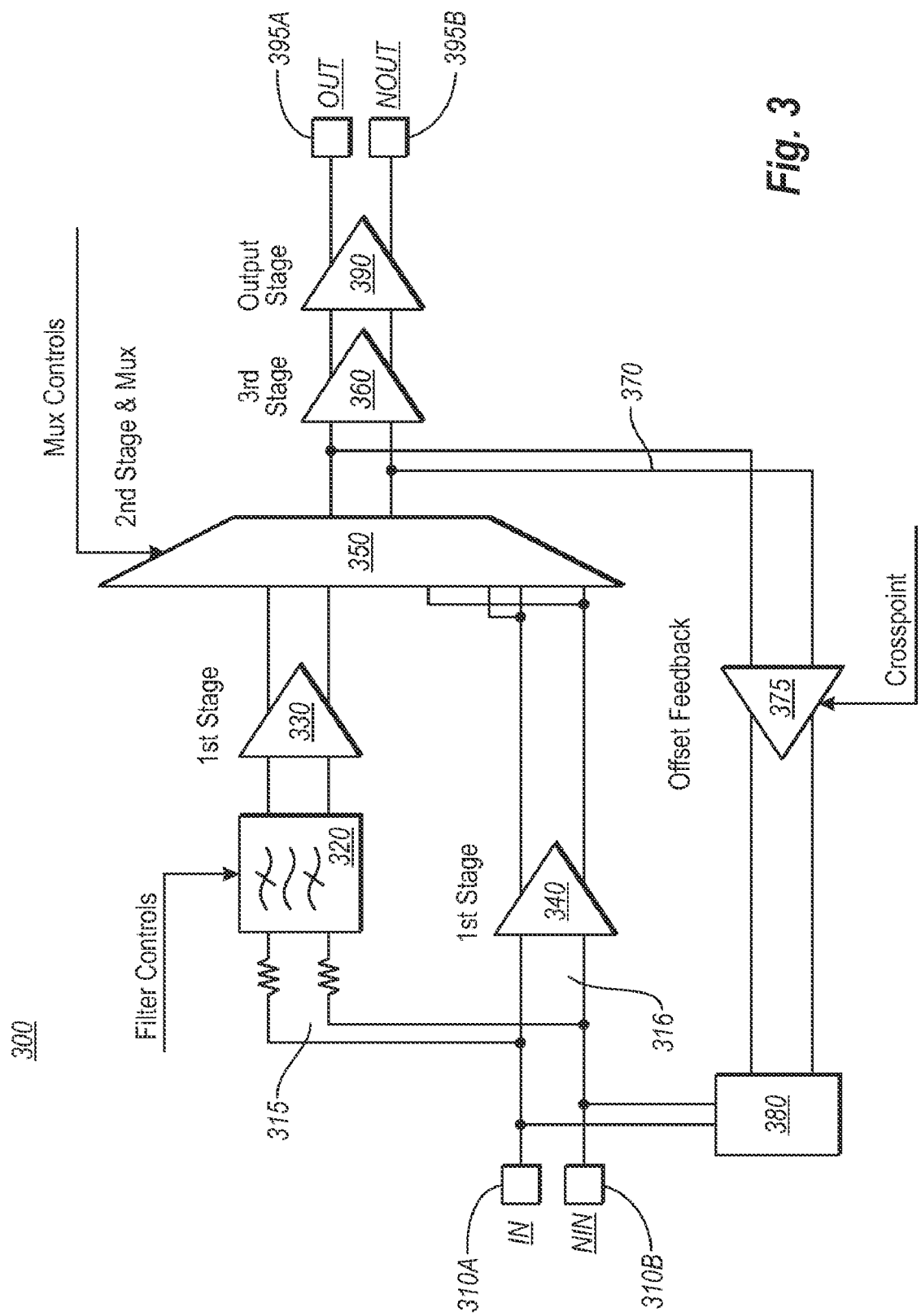
FIG. 3 is a block diagram of an example post-amplifier module of the transceiver of FIG. 2.

Referring now to FIG. 3, a block diagram of an example post-amplifier 300 is shown. The post amplifier 300 may correspond to the post amplifier portion of LD/PA 102 of FIGS. 1 and 2, although this is not required. Note that the following description is for illustration only and should not be used to limit the scope of the appended claims or the embodiments disclosed herein.

Post-amplifier 300 includes a differential input 310A and 310B. The differential input may receive a differential signal from a receiver stage such as ROSA 10 of FIGS. 1 and 2. Specifically, input node 310A receives the positive signal portion and input node 310B receives a complimentary signal portion. As mentioned above, the differential signal received at nodes 310A and 310B may be 1 Gbit/s, 2 Gbit/s, 4 Gbit/s, 10 Gbit/s, as well as even higher data rates. Note that although FIG. 3 and its accompanying description depict the received signal as being differential, the embodiments disclosed herein also apply to a singled ended system.

Post-amplifier 300 further includes a low speed path 315 and a high speed path 316. 1 Gbit/s, 2 Gbit/s, 4 Gbit/s signals are propagated on the low speed path 315 to a filter 320. Filter 320 performs rate selection on the signal. For example, control signals are received that indicate whether a 1 Gbit/s, 2 Gbit/s, or 4 Gbit/s signal should be passed. Any non-selected signals are filtered out.

The filter 320 then provides the selected signal to a low speed path first gain stage 330. The first gain stage 330, which may be comprised of any reasonable components, amplifies the signal. In one embodiment, gain stage 330 is configured to provide 30 dB of gain to the signal.

In like manner, any 10 Gbit/s or higher signals are propagated on the high speed path 316 to a high speed path first gain stage 340, where the signal is amplified. In one embodiment, the gain stage 340, which may also be comprised of any reasonable components, is configured to provide a gain equivalent to the amount provided by gain stage 330.

A second gain stage and multiplexer 350 is then used to select a desired signal and to add additional gain to the signal. For example, second gain stage and multiplexer 350 receives control signals that specify whether to select a signal from low speed path 315 or from high speed path 316. The selected signal is then amplified by second gain stage and multiplexer 350. In one embodiment, second gain stage and multiplexer 350, which may be comprised of any reasonable components, is configured to provide 14 dB of gain to the signal.

Post-amplifier 300 further includes a third gain stage 360. As with the gain stages previously discussed, third gain stage 360 may be implemented with any reasonable components. The third gain stage 360 receives the signal from second gain stage 350 and amplifies the signal. In some embodiments, third gain stage is configured to provide 3 dB of gain to the signal.

The signal is then passed to output stage 390. The differential signal is then provided to output nodes 395A and 395B, where it may be propagated to other components of the optical transceiver 100.

In some embodiments, post-amplifier 300 may include a feedback loop 370. In such embodiments, the signal output from the second gain stage 350 is propagated through the feedback loop 370. The signal passes through gain stage 375, which may be comprised of any reasonable components, where amplification takes place. In some embodiments, cross-point adjustment may occur in gain stage 375. The signal also passes through an offset cancel module 380 that is configured to provide offset cancellation.

Having described an exemplary environment with respect to FIGS. 1, 2 and 3, it will be understood that such environment is only one of countless architectures in which the embodiments described herein may be employed. As previously stated, the embodiments described herein are not intended to be limited to implementation in any particular environment.

III. Example Embodiments of a Circuit Configured to Provide a Boost to a Signal

Figure 4:
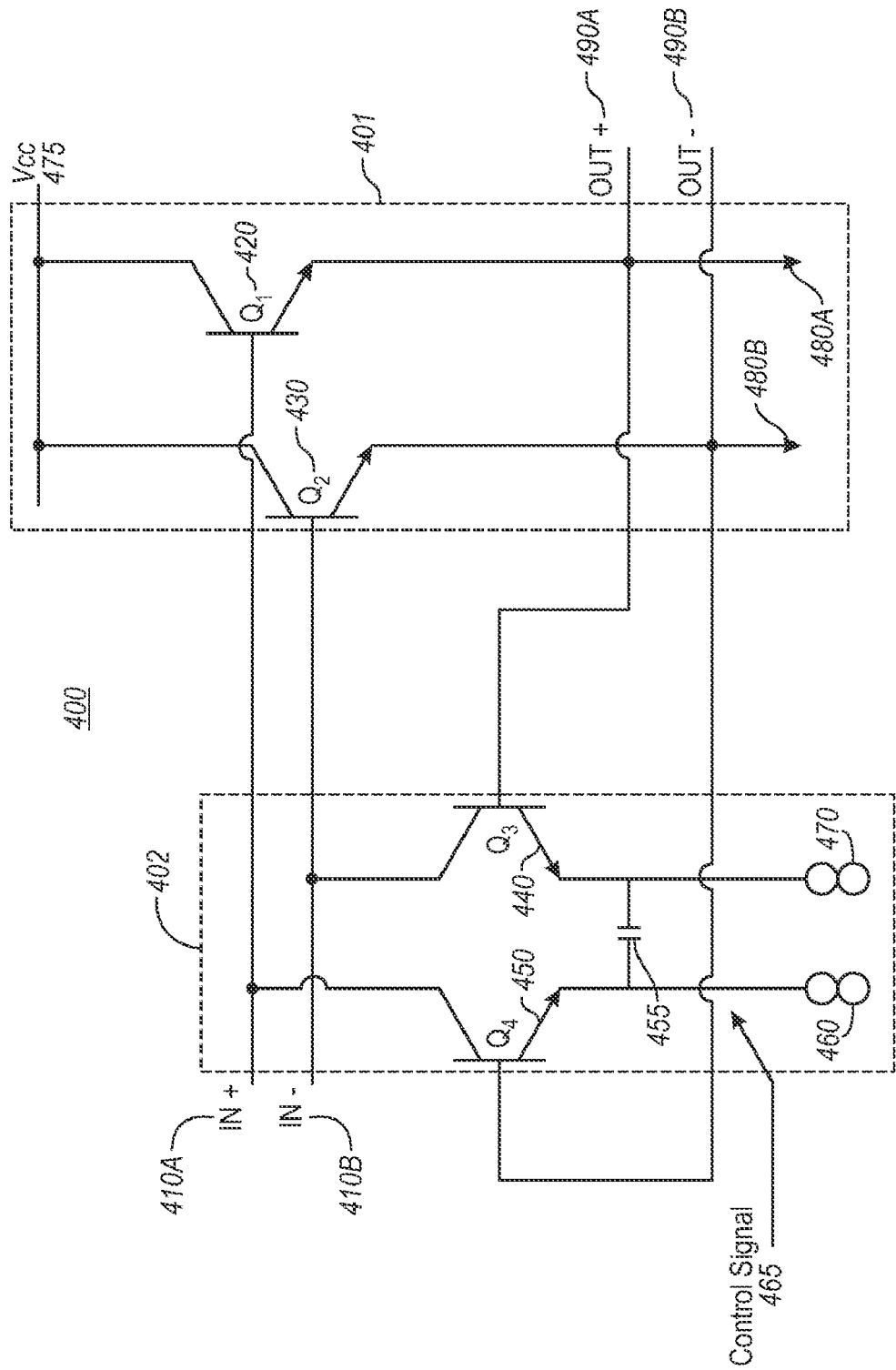
FIG. 4 is a schematic diagram of an embodiment of a circuit configured to provide a boost to a signal in accordance with the principles of the present invention.

Referring now to FIG. 4, an example circuit 400 that is configured to provide a boost to an input signal is illustrated. The circuit 400 may correspond to a portion of the first stage 340 described in relation to FIG. 3, although this is not required. Note that although various components are illustrated as comprising circuit 400, it should be understood that this is for illustration only. The embodiments disclosed herein contemplate a circuit 400 with additional components not illustrated in FIG. 4. Also note that the reference to a first, second, third, etc. component (such as a transistor) in this description and in the claims is not intended to imply any sequential listing and is merely intended to distinguish one component from another.

The circuit or amplifier stage 400 is configured to receive a differential input signal. Specifically, circuit 400 includes an input node 410A for receiving a first data signal and an input node 410B that is configured to receive a second data signal that is complementary to the first data signal. The input nodes 410A and 410B may be coupled to another component of transceiver 100 such as a trans-impendence amplifier of ROSA 10.

The circuit or amplifier stage 400 includes a buffer stage as illustrated by dashed box 401. The first data signal is provided to a first transistor 420 (also labeled as Q1). Specifically, a base terminal of transistor 420 is coupled to the input node 410A. A collector terminal of transistor 420 is configured to be coupled to a voltage source VCC 475, while an emitter of transistor 420 is coupled to a first output node 490A and a voltage source or ground 480A.

As mentioned, the first output node 490A is coupled to the emitter of transistor 420. The first output node 490A is provided for communicating the first data signal to other stages of post-amplifier 300 or to some other component coupled to circuit 400.

The second data signal is provided to a second transistor 430 (also labeled as Q2). Specifically, a base terminal of transistor 430 is coupled to the input node 410B. A collector terminal of transistor 430 is configured to be coupled to the voltage source VCC 475, while an emitter of transistor 430 is coupled to a second output node 490B and a voltage source or ground 480B. The second output node 490B is provided for communicating the second data signal to other stages of post-amplifier 300 or to some other component coupled to circuit 400. As illustrated in FIG. 4, transistors Q1 and Q2 form an emitter-follower pair.

Circuit or amplifier stage 400 also includes a programmable boost stage illustrated by dashed box 402. Programmable boost stage 402 includes a third transistor 440 (also labeled as Q3). A base terminal of transistor 440 is coupled to the output node 490A and the emitter of transistor 420. A collector terminal of transistor 440 is coupled to the second input node 410B and the base of transistor 430. Finally, an emitter terminal of transistor 440 is coupled to a current source 470 and to a first terminal of a capacitor 455. In operation, the current source 470 is configured to draw a current through transistor 440. In some embodiments, current source 470 may be adjustable in order to help with the signal boost provided by circuit 400.

Circuit or amplifier stage 400 further includes a fourth transistor 450 (also referred to as Q4). A base terminal of transistor 450 is coupled to the output node 490B and the emitter of transistor 430. A collector terminal of transistor 450 is coupled to the first input node 410A and the base of transistor 420. Finally, an emitter terminal of transistor 450 is coupled to a current source 460 and to a second terminal of the capacitor 455. In operation, the current source 460 is configured to draw a current through transistor 450. In some embodiments, current source 460 may also be adjustable. In still other embodiments, current source 460 may be the same as current source 470. In such embodiments, the single current source may be coupled to the emitters of both transistors 440 and 450 and may be adjustable in order to help with the signal boost provided by circuit 400.

As mentioned previously, circuit 400 includes a capacitor 455 that has a first terminal coupled to the emitter of transistor 440 and a second terminal coupled to the emitter of transistor 450. In some embodiments, capacitor 455 may be an adjustable or variable capacitor whose capacitance value is adjustable in order to help with the signal boost provided by circuit 400.

As described above, in some embodiments capacitor 455 and/or current sources 460 and/or 470 may be adjustable. In such embodiments, transistors 440 and 450 may be coupled to a digital controller such as control module 105 of FIG. 1, although the digital controller may alternatively be part of the host computer 111 or some other source. The capacitor 455 and/or the current sources 460 and 470 may receive control signals 465 from the digital controller that cause the adjustment of the capacitance value of capacitor 455 and/or cause the adjustment of the amount of current provided by the current sources. In other embodiments, the control signals 465 may cause the transistors 440 and 450 to turn on or off. Thus, transistors 440 and 450 may be viewed as a programmable cross coupled differential pair as the signal boost they provide may be adjustable by adjusting the value of capacitance 455 and/or the current provided by the current sources.

Figure 5:
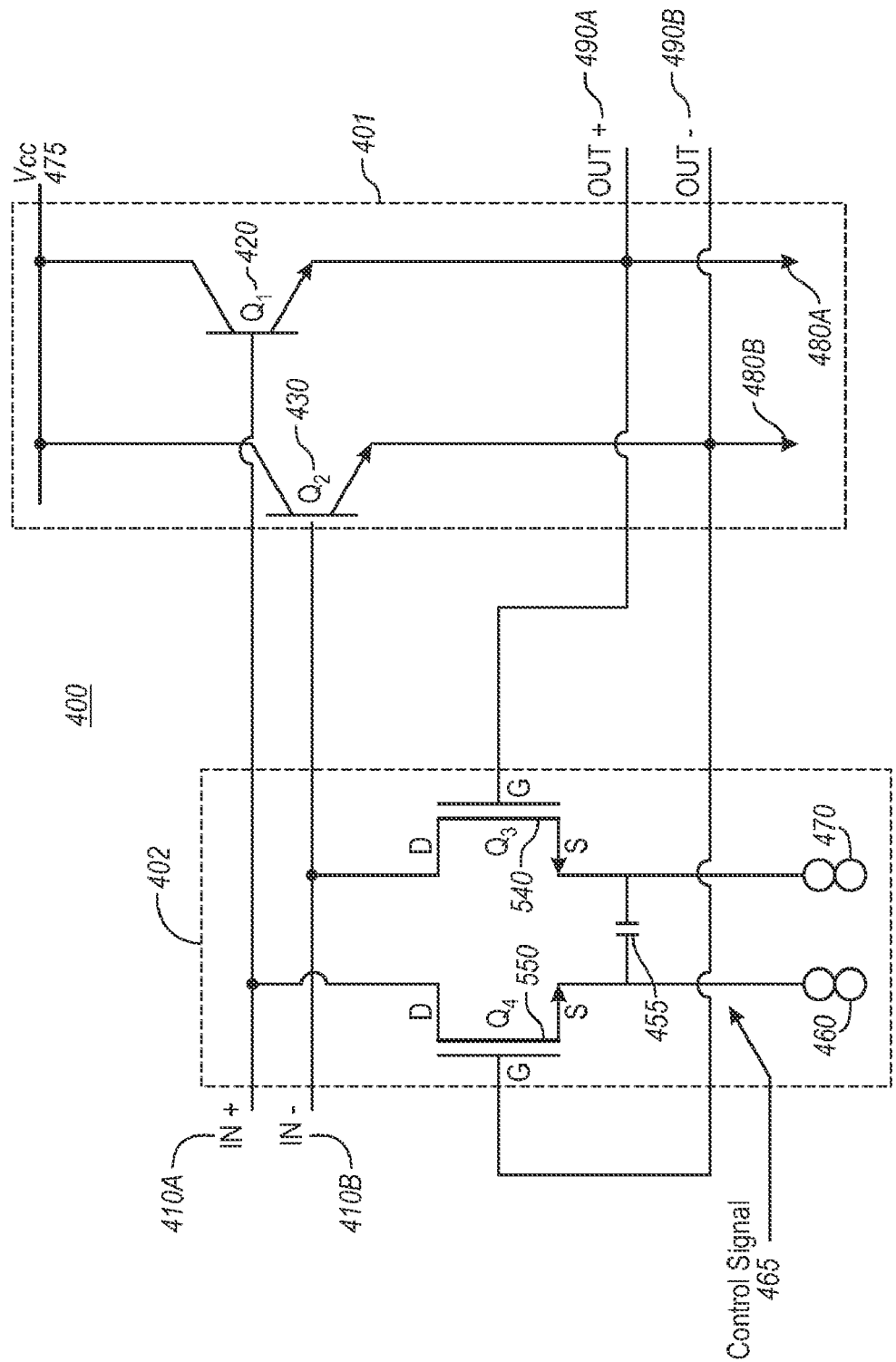
FIG. 5 is a schematic diagram of a further embodiment of a circuit configured to provide a boost to a signal in accordance with the principles of the present invention.

Referring to FIG. 5, an alternative embodiment of programmable boost stage 402 is illustrated. In this embodiment, the transistors are implemented as FET transistors. For example, a third transistor 540 (also labeled as Q3) has a gate terminal coupled to the output node 490A and the emitter of transistor 420. A drain terminal of transistor 540 is coupled to the second input node 410B and the base of transistor 430. Finally, a source terminal of transistor 540 is coupled to the current source 470 and to the first terminal of the capacitor 455. In operation, the current source 470 is configured to draw a current through transistor 540. In some embodiments, current source 470 may be adjustable in order to help with the signal boost provided by circuit 400.

Circuit or amplifier stage 400 further includes a fourth transistor 550 (also referred to as Q4). A gate terminal of transistor 550 is coupled to the output node 490B and the emitter of transistor 430. A drain terminal of transistor 550 is coupled to the first input node 410A and the base of transistor 420. Finally, a source terminal of transistor 550 is coupled to the current source 460 and to the second terminal of the capacitor 455. In operation, the current source 460 is configured to draw a current through transistor 550. In some embodiments, current source 460 may also be adjustable. In still other embodiments, current source 460 may be the same as current source 470. In such embodiments, the single current source may be coupled to the sources of both transistors 540 and 550 and may be adjustable in order to help with the signal boost provided by circuit 400.

As described above, in some embodiments capacitor 455 and/or current sources 460 and/or 470 may be adjustable. In such embodiments, transistors 540 and 550 may be coupled to a digital controller such as control module 105 of FIG. 1, although the digital controller may alternatively be part of the host computer 111 or some other source. The capacitor 455 and/or the current sources 460 and 470 may receive control signals 465 from the digital controller that cause the adjustment of the capacitance value of capacitor 455 and/or cause the adjustment of the amount of current provided by the current sources. In other embodiments, the control signals 465 may cause the transistors 540 and 550 to turn on or off. Thus, transistors 540 and 550 may be viewed as a programmable cross coupled differential pair as the signal boost they provide may be adjustable by adjusting the value of capacitance 455 and/or the current provided by the current sources.

IV. Operation of the Circuit Configured to Provide a Boost to a Signal

As previously discussed, it is typical for a transceiver module to undergo a Stress Receive Sensitivity (SRS) test. In such a test, a test signal is fed into the transceiver module that purposefully collapses the interior of the eye opening of an output signal eye pattern to approximately half open or 50%. This makes it difficult for the post-amplifier to determine if a subsequently received data signal is a logical 0 or a logical 1. Additionally, the eye opening of the pattern may be collapsed through signal attenuation in the circuit. Advantageously, the circuit or amplifier stage of the present invention helps to provide a boost to an input signal at higher frequencies that helps to open the interior eye opening of an eye pattern. This in turn makes it easier for the post-amplifier to determine if the incoming data signal is a logical 0 or a logical 1.

In operation, a differential signal is provided to input nodes 410A and 410B. The differential signal is then provided to the emitter-follower pair comprising transistors 420 and 430. The emitter-follower pair, which functions as a buffer stage or amplifier 401, provides amplification to the signal at output nodes 490A and 490B. As is well known in the art, buffer amplifiers are typically implemented to connect a high-resistance source with a low-resistance load without significant signal attenuation while still providing modest voltage gain.

As illustrated in FIGS. 4 and 5, the positive portion of the differential signal (i.e., the first data signal) is fed back into the cross coupled differential pair, specifically transistors 440 or 540, while the negative portion of the differential signal (i.e., the second data signal) is fed back into transistors 450 or 550, depending on the embodiment implemented. This signal is applied across capacitor 455, which in turn causes a current to be pulled through transistors 440 or 540 to current source 470 and a current to be pulled through transistors 450 or 550 to current source 460. The current at the collector of transistor 440 or the drain of transistor 540 is summed with second data signal and the current at the collector of transistor 450 or the drain of transistor 550 is summed with the first data signal. This summing thus provides a boost to the signal that is transmitted at output nodes 490. In some embodiments, a signal boost of 1 dB to 3 dB may be provided.

Note that the polarity of the signals of transistors 440 and 450 and transistors 540 and 550 are reversed when summed with the first and second data signals. That is, a positive signal is received at the base the transistor 440 or at the gate of transistor 540, but the signal at the collector of transistor 440 or the drain of transistor 540 sums with the negative or second data signal. Similarly, a negative signal is received at the base of transistor 450 or at the gate of transistor 540, but the signal at the collector of transistor 450 or the drain of transistor 550 sums with the positive or first data signal. This connection provides for a 180 degree phase shift of the signals, which in turn causes the effects of the capacitor to look inductive at the collectors of transistors 440 and 450 or the drains of transistors 540 and 550. Accordingly, the summation of the signals will provide a positive feedback, which in turn provides a desired positive boost to open the interior eye of the eye diagram or pattern.

As is well known in the art, the capacitor 455 will act to limit the wideband frequency response of transistors 440 and 450 or transistors 540 and 550. For example, capacitor 455 will block current from flowing at DC. However, as the frequency of the applied signal increases, capacitor 455 will begin to cause the current to flow in the transistors. Thus, as frequency increases, current will be present at the collectors of transistors 440 and 450 or the drains of transistors 540 and 550. As mentioned, this current will be summed into the first and second data signals to provide a boost. At high frequencies, for example at 10 GHz or higher, sufficient current may be present to provide the desired boosting.

As mentioned previously, in some embodiments, capacitor 445 and/or one or both of the current sources 460 and 470 are adjustable. In such embodiments, the current provided for boosting or peaking the differential signal may be controlled by adjusting the value of capacitor 455 and/or the amount of current provided by one or both of the current sources. As is well known in the art, the frequency response of transistors 440 and 450 and transistors 540 and 550 is controlled by the $g_m c$ parameter of the transistor pair. The $g_m$ portion of the parameter is proportional to the amount of current provided to the transistors, while the c portion of the parameter is the capacitance value of the transistor pair.

Thus, a control signal 465 may be received from control module 105 that adjusts the amount of current provided by one or both of adjustable current sources 460 and 470. Such current adjustment will affect the $g_m$ parameter of the transistor pairs, which in turn will affect the frequency response of the differential pairs. Accordingly, the amount of current provided at the collectors of transistors 440 and 450 or the drains transistors 540 and 550 may be adjusted up or down based on adjustments made to the amount of current provided by the current sources. Obviously, this adjustment will adjust the amount of boost provided by the circuit 400.

Similarly, a control signal 465 may be received from control module 105 that adjusts the capacitive value of an adjustable capacitor 455. Such adjustments in the capacitive value will affect the c parameter of the transistor pairs, which in turn will affect the frequency response of the differential pairs. Accordingly, the amount of current provided at the collectors of transistors 440 and 450 or at the drains of transistors 540 and 550 may be adjusted up or down on based on adjustments of the capacitive value of capacitor 455. This adjustment will accordingly adjust the amount of boost provided by the circuit 400.

In some situations, however, it may not be desirable to provide a boost to the first and second data signals received at input nodes 410A and 410B. For example, it may be desirable to conserve current usage in the post-amplifier. In such cases, the digital controller such as control module 105 may provide control signals 465 that turn off current sources 460 and 470, thus turning off the differential pair comprising transistors 440 and 450 or transistors 540 and 550. Any differential signals received at the input nodes would be passed through the emitter-follower pair of transistors 420 and 430, but would receive no boost from the differential pair. At a later time, a control signal 465 may be received that turns on the current sources, thus allowing transistors 440 and 450 or transistors 540 and 550 to provide the boost as previously described.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A post-amplifier stage comprising:
a first input node configured to receive a first data signal;
a second input node configured to receive a second data signal that is complementary to the first data signal;
a first output node;
a second output node;
a buffer stage having a first node coupled to the first input node, a second node coupled to the second input node, a third node coupled to the first output node, and a fourth node coupled to the second output node, wherein the buffer stage comprises:
  a first transistor having a base terminal coupled to the first input node, having an emitter terminal coupled to the first output node, and having a collector node configured to be connected to a voltage source when operational; and
  a second transistor having a base terminal coupled to the second input node, having an emitter terminal coupled to the second output node, and having a collector node configured to be connected to a voltage source when operational; and
a programmable boost stage having a fifth node coupled to the first output node, a sixth node coupled to the second output node, a seventh node coupled to the first input node, and an eighth node coupled to the second input node, wherein the programmable boost stage is configured to adjust a signal at the seventh node or to adjust a signal at the eighth node.

2. A post-amplifier stage comprising:
a first input node configured to receive a first data signal;
a second input node configured to receive a second data signal that is complementary to the first data signal;
a first output node;
a second output node;
a buffer stage having a first node coupled to the first input node, a second node coupled to the second input node, a third node coupled to the first output node, and a fourth node coupled to the second output node; and
a programmable boost stage having a fifth node coupled to the first output node, a sixth node coupled to the second output node, a seventh node coupled to the first input node, and an eighth node coupled to the second input node, wherein the programmable boost stage is configured to adjust a signal at the seventh node or to adjust a signal at the eighth node, wherein the programmable boost stage comprises:
  a first transistor having a base terminal coupled to the first output node and having a collector terminal coupled to the second input node;
  a second transistor having a base terminal coupled to the second output node and having a collector terminal coupled to the first input node;
  a capacitor having a first terminal coupled to an emitter terminal of the first transistor and having a second terminal coupled to an emitter terminal of the second transistor; and
  at least one current source coupled to the emitter terminal of the first transistor and the emitter terminal of the second transistor;
  wherein the first and second transistors comprise a programmable differential pair that may be programmed to adjust a signal at the collector of the first transistor that is summed into the second data signal and to adjust a signal at the collector of the second transistor that is summed into the first data signal.

3. The post-amplifier stage in accordance with claim 2, wherein the at least one current source is an adjustable current source that receives control signals from a digital controller coupled to the programmable differential pair such that adjusting the adjustable current source programs the programmable differential pair.

4. The post-amplifier stage in accordance with claim 2, wherein the capacitor is an adjustable capacitor that receives control signals from a digital controller coupled to the programmable differential pair such that adjusting the value of the adjustable capacitor programs the programmable differential pair.

5. The post-amplifier stage in accordance with claim 1, wherein the programmable boost stage comprises:
a first transistor having a gate terminal coupled to the first output node and having a drain terminal coupled to the second input node;
a second transistor having a gate terminal coupled to the second output node and having a drain terminal coupled to the first input node;
a capacitor having a first terminal coupled to an source terminal of the first transistor and having a second terminal coupled to an source terminal of the second transistor; and
at least one current source coupled to the source terminal of the first transistor and the source terminal of the second transistor;
wherein the first and second transistors comprise a programmable differential pair that may be programmed to adjust a signal at the drain of the first transistor that is summed into the second data signal and to adjust a signal at the drain of the second transistor that is summed into the first data signal.

6. The post-amplifier stage in accordance with claim 5, wherein the at least one current source is an adjustable current source that receives control signals from a digital controller coupled to the programmable differential pair such that adjusting the adjustable current source programs the programmable differential pair.

7. The post-amplifier stage in accordance with claim 5, wherein the capacitor is an adjustable capacitor that receives control signals from a digital controller coupled to the programmable differential pair such that adjusting the value of the adjustable capacitor programs the programmable differential pair.

8. An optical transceiver module comprising a ROSA, a TOSA and the post-amplifier stage in accordance with claim 1.

9. A circuit for providing a signal boost comprising:
a first input node configured to receive a first data signal;
a second input node configured to receive a second data signal that is complementary to the first data signal;
a first output node;
a second output node;
a first transistor having a base terminal coupled to the first input node, having an emitter terminal coupled to the first output node, and having a collector node configured to be connected to a voltage source when operational;
a second transistor having a base terminal coupled to the second input node, having an emitter terminal coupled to the second output node, and having a collector node configured to be connected to a voltage source when operational;
a third transistor having a base terminal coupled to the first output node and the emitter terminal of the first transistor and having a collector terminal coupled to the second input node;
a fourth transistor having a base terminal coupled to the second output node and the emitter terminal of the second transistor and having a collector terminal coupled to the first input node;
a capacitor having a first terminal coupled to an emitter terminal of the third transistor and having a second terminal coupled to an emitter terminal of the fourth transistor; and
at least one adjustable current source coupled to the emitter terminal of the third transistor and the emitter terminal of the fourth transistor.

10. The circuit in accordance with claim 9, wherein a signal at the collector of the third transistor is summed into the second data signal and a signal at the collector of the fourth transistor is summed into the first data signal to provide a boost to the first and second data signals.

11. The circuit in accordance with claim 10, wherein the signal at the collector of the third and fourth transistors provide between 1 dB and 3 dB of boost to the first and second data signals.

12. The circuit in accordance with claim 10, wherein the boost provided to the first and second data signals is configured to open an interior eye of an eye pattern of the first and second data signal at the first and second output nodes.

13. The circuit in accordance with claim 10, wherein the boost provided to the first and second data signals is adjusted up and down by adjusting the current provided by the at least one adjustable current source, wherein adjusting the current provided by the at least one current source adjusts the $g_m$ parameter of the transistor pair comprising the third and fourth transistors.

14. The circuit in accordance with claim 9, wherein the circuit is coupled to a digital controller that provides control signals that cause the at least one adjustable current source to adjust and that turn on the third and fourth transistors.

15. The circuit in accordance with claim 9, wherein the at least one adjustable current source is a first adjustable current source that is coupled to the emitter of the third transistor, the circuit further comprising:
a second adjustable current source coupled to the emitter of the fourth transistor.

16. The circuit in accordance with claim 15, wherein the circuit is coupled to a digital controller that provides control signals that cause the second adjustable current source to adjust.

17. An optical transceiver comprising a ROSA, a TOSA, and a post-amplifier, the post-amplifier including the circuit in accordance with claim 9.

18. A circuit for providing a signal boost comprising:
a first input node configured to receive a first data signal;
a second input node configured to receive a second data signal that is complementary to the first data signal;
a first output node;
a second output node;
a first transistor having a base terminal coupled to the first input node, having an emitter terminal coupled to the first output node, and having a collector node configured to be connected to a voltage source when operational;
a second transistor having a base terminal coupled to the second input node, having an emitter terminal coupled to the second output node, and having a collector node configured to be connected to a voltage source when operational;
a third transistor having a base terminal coupled to the first output node and the emitter terminal of the first transistor and having a collector terminal coupled to the second input node;
a fourth transistor having a base terminal coupled to the second output node and the emitter terminal of the second transistor and having a collector terminal coupled to the first input node;
an adjustable capacitor having a first terminal coupled to an emitter terminal of the third transistor and having a second terminal coupled to an emitter terminal of the fourth transistor; and
at least one current source coupled to the emitter terminal of the third transistor and the emitter terminal of the fourth transistor.

19. The circuit in accordance with claim 18, wherein a signal at the collector of the third transistor is summed into the second data signal and a signal at the collector of the fourth transistor is summed into the first data signal to provide a boost to the first and second data signals.

20. The circuit in accordance with claim 19, wherein the signal at the collector of the third and fourth transistors provide between 1 dB and 3 dB of boost to the first and second data signals.

21. The circuit in accordance with claim 19, wherein the boost provided to the first and second data signals is configured to open an interior eye of an eye pattern of the first and second data signal at the first and second output nodes.

22. The circuit in accordance with claim 19, wherein the boost provided to the first and second data signals is adjusted up and down by adjusting the value of the adjustable capacitor, wherein adjusting the value of the adjustable capacitor adjusts the c parameter of the transistor pair comprising the third and fourth transistors.

23. A system including a digital controller coupled to the circuit in accordance with claim 18, wherein the a digital controller provides control signals that adjust the value of the adjustable capacitor.

* * * * *